US006405351B1

(12) United States Patent
Steiss et al.

(10) Patent No.: US 6,405,351 B1
(45) Date of Patent: Jun. 11, 2002

(54) SYSTEM FOR VERIFYING LEAF-CELL CIRCUIT PROPERTIES (75) Inventors: Donald E. Steiss, Richardson; Anthony M. Hill, Dallas; Richard P. Wiley, Lucas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 163 days.

(21) Appl. No.: 09/603,708

(22) Filed: Jun. 27, 2000

(51) Int. Cl.$^7$ ............................................. G06F 17/50
(52) U.S. Cl. ............................................. 716/5; 716/12
(58) Field of Search ............................. 716/1–5, 11–15, 716/18

(56) References Cited

U.S. PATENT DOCUMENTS

| | | | |
|---|---|---|---|
| 4,651,284 A | | 3/1987 | Watanabe et al. ............... 716/8 |
| 4,942,536 A | | 7/1990 | Watanabe et al. ............... 716/3 |
| 5,202,841 A | * | 4/1993 | Tani ............................... 716/5 |
| 5,949,691 A | * | 9/1999 | Kurosaka et al. ............... 716/2 |
| 6,009,251 A | * | 12/1999 | Ho et al. ......................... 716/5 |
| 6,011,911 A | * | 1/2000 | Ho et al. ......................... 716/5 |
| 6,117,179 A | * | 9/2000 | Tan et al. ...................... 703/14 |
| 6,289,491 B1 | * | 9/2001 | Dupenloup ..................... 716/5 |

OTHER PUBLICATIONS

"CadMOS Design Technology Announces ArctIC™, An Elctrical Rule Checker for SOC Designs,", 2 pages; Jun. 26, 2000.

* cited by examiner

Primary Examiner—Matthew Smith
Assistant Examiner—Paul Dinh
(74) Attorney, Agent, or Firm—Robert D. Marshall, Jr.; W. James Brady, III; Frederick J. Telecky, Jr.

(57) ABSTRACT

A computer system (10). The computer system comprises processing circuitry (14) and storage circuitry (24) for storing a plurality of files. The plurality of files include a circuit description file (24$_3$) comprising data describing devices and signals in a circuit. The plurality of files also include a plurality of list expressions (24$_4$) relating to one of devices, signals, or devices and signals described by the data in the circuit description. Still further, the plurality of files also include a plurality of rules (24$_5$). The processing circuitry is programmed to perform various steps. These steps include processing (34) the plurality of list expressions to extract a plurality of lists in response to the circuit description. Each of the plurality of lists comprises a non-negative integer number of elements. The programmed steps further include processing (38) the plurality of rules to evaluate one or more of the plurality of lists to verify connection accuracy within the circuit in response to the non-negative integer number of elements.

32 Claims, 3 Drawing Sheets

| $n_1$ | 0 | 0 | 1 | 0 | 1 | 0 | 0 | 0 | 0 | 0 | 0 | 0 | 1 | 0 | 0 | 0 | 0 | 0 | 0 | 0 |
|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 |

CHARACTERISTIC IDENTIFIER

FIG. 5b

| $n_4$ | 0 | 0 | 2 | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 |

CHARACTERISTIC IDENTIFIER

FIG. 6a

| $n_1$ | $NCV(N_1)$ | $NCV(N_2,N_4,N_5)$ | $NCV(N_3)$ | − |
|---|---|---|---|---|
| | 0 | 1 | 2 | 3 |

RADIUS

FIG. 6b

| $n_4$ | $NCV(N_4)$ | $NCV(N_1,N_3)$ | $NCV(N_2,N_5)$ | − |
|---|---|---|---|---|
| | 0 | 1 | 2 | 3 |

RADIUS

SYSTEM FOR VERIFYING LEAF-CELL CIRCUIT PROPERTIES

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to circuit design, and are more particularly directed to computer-aided circuit design connection verification.

Electronic circuits continue to advance in various manners including application, complexity, and size. These advancements and other factors have led to a circuit design approach that often involves many persons, particularly for designs using large scale integrated circuit (LSI) or very large scale integrated circuit (VLSI) technologies. Often, different persons may have different responsibilities in developing a final integrated circuit. In one approach, a team may be formed where a master designer sets forth various rules to govern some or all types of circuits to be used in an overall design, and then other persons as circuit designers develop smaller circuit designs (or "sub-circuits") while complying with the master designer's rules. By way of an example a processor device may be designed by such a team and using domino logic, where the master designer establishes various rules to be followed by all domino logic used in any sub-circuit that will form a part of the processor device. To further implement this approach, once each circuit designer has completed his or her designs, then those designs are reviewed to ensure compliance with the master designer's rules. As a result, the master designer's rules often reduce functionality and/or performance problems that otherwise may arise if widespread discretion is given to each individual circuit designer.

While the above approach to circuit design provides the benefits arising from a master control, it also provides certain drawbacks. For example, the techniques for ensuring that the circuit designers have complied with the master designer's rules may be time consuming, tedious, and subject to error. Particularly, often the ultimate responsibility for checking that the circuit designer's designs have complied with the master designer's rules is given solely to the master designer and, thus, can require a deal of effort, time, and attention by the master designer. Further, the master designer in making the compliance evaluation is still subject to human error and, thus, may unintentionally oversee one or more compliance failures. Thus, these failures may remain in the overall circuit design, and may well cause difficulties later in the circuit development, such as once the circuit is reduced to silicon and tested or implemented.

In view of the above, there arises a need to address the drawbacks of circuit design, as is achieved by the preferred embodiments described below.

BRIEF SUMMARY OF THE INVENTION

In the preferred embodiment, there is a computer system. The computer system comprises processing circuitry and storage circuitry for storing a plurality of files. The plurality of files include a circuit description file comprising data describing devices and signals in a circuit. The plurality of files also include a plurality of list expressions relating to one of devices, signals, or devices and signals described by the data in the circuit description. Still further, the plurality of files also include a plurality of rules. The processing circuitry is programmed to perform various steps. These steps include processing the plurality of list expressions to extract a plurality of lists in response to the circuit description. Each of the plurality of lists comprises a non-negative integer number of elements. The programmed steps further include processing the plurality of rules to evaluate one or more of the plurality of lists to verify connection accuracy within the circuit in response to the non-negative integer number of elements. Other circuits, systems, and methods are also disclosed and claimed.

DETAILED DESCRIPTION OF THE INVENTION

Figure 1:
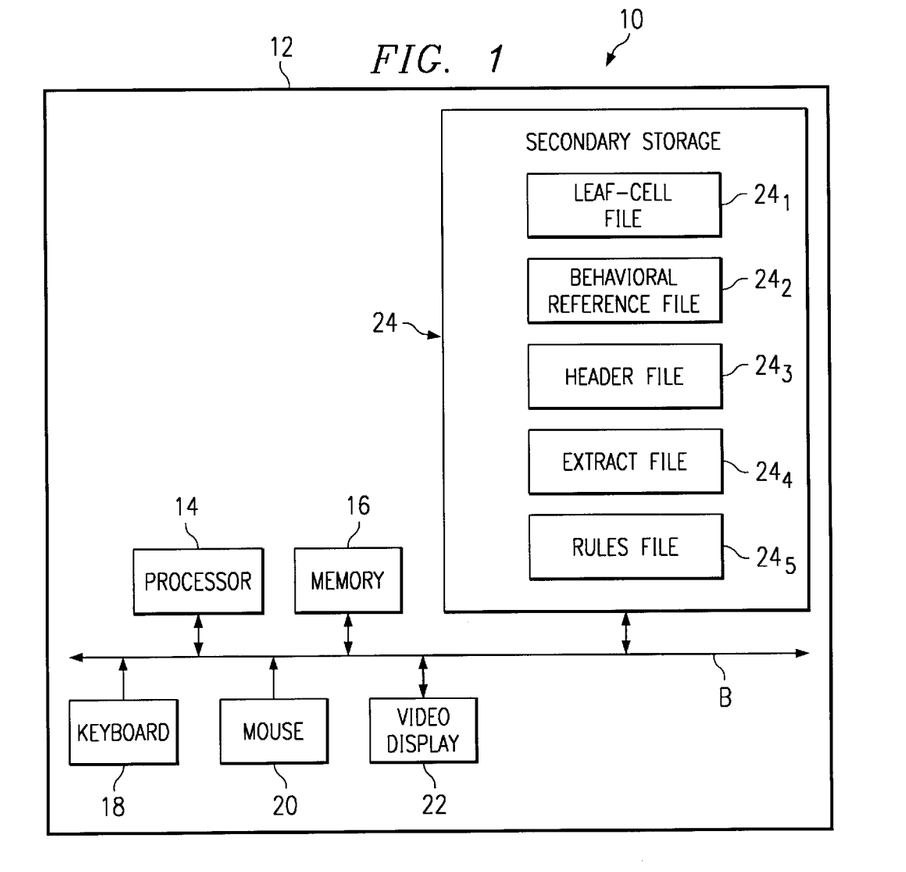
FIG. 1 illustrates a block diagram of a computer system according to the preferred embodiment.

FIG. 1 illustrates an electrical block diagram of a system 10 for verifying circuit designs. System 10 includes a computer 12 which may be of various types such as a personal computer ("PC"), a workstation, or other processing devices operable to perform. the preferred functionality described in this document. Computer 12 includes a processor 14 (e.g., CPU, or other single or multiple processors) having access via a bus B to a memory 16, where memory 16 may be one or more memories capable of storing various types of data. Computer 12 further includes one or more input/output devices, as may be selected by one skilled in the art. By way of example, such devices in FIG. 1 include a keyboard 18, a mouse 20, and a video display 22, each operable as known in the art. Of course, other input/output devices also may be added to computer 12 (e.g., scanner, touch pad, digitizer pad, printer, and so forth).

Computer 12 further includes a secondary storage block 24, where block 24 may include various peripherals ascertainable by one skilled in the art for providing data; such peripherals may include, by way of example, a floppy disk drive, a hard disk drive, a CD ROM drive, an optical drive, and so forth. In the preferred embodiment, one or more of these peripheral devices stores program data and user provided data, where that data may be loaded into memory 16 in order to program computer 12 to perform various circuit verification operations to evaluate the accuracy of connections in a circuit design as detailed later. Secondary storage block 24 preferably includes various different file types, where each file includes data permitting the circuit verification of the preferred embodiment. The preferred files include a leaf-cell file $24_1$, an optional behavioral reference file $24_2$, a header file $24_3$, an extract file $24_4$, and a rules file $24_5$. Each of files $24_1$ through $24_5$ is detailed below and demonstrated by specific examples, but as context to the preferred embodiment a brief introduction of each is first presented below.

Leaf-cell file $24_1$ provides circuit design data at the smallest design level using transistors (and possibly other devices) in a hierarchical design methodology. Further in this regard and in the preferred embodiment, leaf-cell file $24_1$ includes a netlist of a circuit design where it is desired under the preferred embodiment to evaluate the circuit design using system 10. The netlist identifies circuit components (e.g., transistors, resistors, capacitors, inductors, and so forth), signals, and connections at the lowest circuit level that is instantiated in the circuit design to be evaluated, where such a level therefore corresponds to what is referred to in the design art as "leaf-cell data." Further, any portion of the leaf-cell data may be collected into a group to define a sub-circuit, that is, a portion of the entire circuit represented by the netlist. The netlist may be in various known electronic data forms, such as SPICE, Verilog, or EDIF, and where such an electronic format is used, the data may be stored as file $24_1$ in storage block 24. Alternatively, however, the leaf-cell data may be provided in non-electronic forms, including written schematics (in which case such data is not readily stored in block 24). In any event, the leaf cell data is used to create additional computer information detailed below and that information is then analyzed to perform the preferred circuit verification. Returning to the instance of the leaf-cell data in an electronic form, if the form provided by the user is not in a flattened form, then a preprocessor also should be specified to process the netlist to provide a flattened format which thereby removes all hierarchy from the circuit and reduces it to devices and connections of those devices.

Behavioral reference file $24_2$ models the circuit functionality at what is referred to in the art as the "behavioral level," meaning-modeling functionality correctly, but without regard to exact clock-cycle by clock-cycle behavior. Further, a VHDL behavior model is a program-like description, similar to the ADA-language, of what the designer expects a circuit to do. One currently popular example of behavioral reference file $24_2$ is a VHDL behavioral reference model.

In the preferred embodiment, each of header file $24_3$, extract file $24_4$, and rules file $24_5$ is presented as a block of computer code. Thus, by way of example and to introduce a convention for this document, each of these files commences in the computer code with a "begin" statement and completes with an "end" statement, as shown immediately below, where comment lines are shown in the code preceded by a double dash (i.e., "- -").

begin header
      - - one or more header lines to be inserted
   end header;
   begin extracts
      - - one or more extract lines to be inserted
   end extracts;
   begin rules
      - - one or more rule lines to be inserted
   end rules;

In the preferred embodiment, computer 12 processes files $24_3$, $24_4$, and $24_5$ to verify properties about the circuit design described by file $24_1$. More particularly, header file $24_3$ is manually produced information that specifies the allowable device types in the leaf cell file $24_1$, and includes device definitions, including device names, terminal names, parameter names, and a switch-level device truth table, and other aspects also may be included as discussed later. Extract file $24_4$ both includes and creates lists, where these lists consist of either devices, signals, or both devices and signals, as formed from the circuit information provided by header file $24_3$. For the sake of reference in the remainder of this document, each item (i.e., device or signal) in an extract file list is referred to as an "element." In the preferred embodiment, certain of the extract file lists are automatically generated while others may be generated using various expressions. Note also by way of introduction that by forming lists in this manner, each list necessarily includes a non-negative integer number of elements. Rules file $24_5$ includes one or more lines of code to further apply the rules to govern the designs of the circuit; for the example introduced in the Background of the Invention section of this document, rules file $24_5$ in conjunction with the lists formed in extract file $24_4$ implement the master designer's rules, written in a form that is usable by the preferred embodiment, and which therefore determines whether sub-circuits represented in file $24_1$ comply with the master designer's rules. Further, and as appreciated later, under the preferred embodiment each rule in rules file $24_5$ is written to evaluate the integer number of elements in a resulting list in extract file $24_4$, and that evaluation determines whether the corresponding rule has been satisfied.

The functions of each of header file $24_3$, extract file $24_4$, and rules file $24_5$ in the preferred embodiment are now further explored and appreciated given the manner in which those files are implemented. Thereafter, a description and Figures are provided demonstrating the relationship between these files and the ultimate processing of these files for purposes of circuit design verification. As a further matter of introduction, recall that files $24_3$, $24_4$, and $24_5$ are preferably implemented as lines of computer code. Accordingly, various formats for such code are provided below, and the following conventions are assumed. First, text shown alone and without a further indication represents a word or command recognized when the code is analyzed (e.g., interpreted). Second, items shown in brackets are variable names to be provided by the user. Third, items shown in parenthesis may or may not be required.

Looking first to the functionality provided by header file $24_3$, recall that includes, among other things, device definitions. These device definitions are preferably implemented by a program code statement in the form of:

Device definition [name1] ([name2]) ([port 1] [direction 1] . . . [port n] [direction n]);

The preceding device definition statement declares any device type that occurs in the netlist (e.g., SPICE) source file provided by leaf-cell file $24_1$. More particularly, the device definition statements are not part of the netlist, but instead, the statements are manually entered to define the properties of all of the lowest level primitives specified in the netlist. For example, if a netlist described a network composed of resistors, capacitors and bipolar transistors, there must be a device definition for each of these device types in header file $24_3$. Each device that is later referred to in files $24_3$ or $24_4$ must be specified by a definition statement prior to the later use. Looking to the variables in the device definition statement, [name1] is the first character in the netlist item name that corresponds to the device. If the device identified by [name1] is further represented by a model, then the name of that model is specified by [name2]. Further, when more than one device exists in the netlist and that may be represented with a same name and model type, then only a single device definition statement is entered in header file $24_3$. Additionally, when the device does not require a model name, [name2] should specify "-". Also in this case, when more than one device exists in the netlist and that may be represented with only with the same name and without a model type, then only a single device definition statement is entered in header file $24_3$ for these devices. Finally, the last parenthesis of the statement includes what is referred to herein as a port list for identifying any signal associated with either a device or a boundary relating to a device. More particularly, as known in the leaf-cell art, a port (or more than one port) is defined relative to the leaf-cell based on a boundary with respect to that cell. For example, if a boundary is defined around a single device, then each signal connected to the device defines a port connection to the device; thus, for the instance of a single device within the boundary, the number of ports equals the number of terminals on the single device. However, a boundary may be defined which encloses more than one device. In this latter case, any signal that crosses that boundary thereby defines a corresponding port. Thus, a boundary enclosing multiple devices will define along the boundary one or more signals going into, out from, or possibly both into and out from, the boundary—this signal or signals defines a number of ports less than the total of all terminals of the enclosed devices because some terminals within the boundary will connect to signals that do not cross the boundary and, therefore, those terminals and signals are excluded from the port definition. Looking now to the port list in the device definition statement, each variable [port x] identifies a name of a port of the device (or boundary), and the immediately following variable [direction x] identifies the direction or "port type" of that port, where in the preferred embodiment a port type following a port has a value of either IN, OUT, or INOUT. In the preferred embodiment, the order of the port definitions should match the order of the ports on the device as specified in the netlist. Lastly, note that when rules are applied to devices as further detailed later, the rules refer to devices by model (i.e., [name2]) unless the value thereof equals "-" in which case the rule. refers to the device by [name1].

To further appreciate the device definition statement, a few examples are now considered; As a first example, the following device definition statement may be used to define a resistor of device name R and with no model, where the port list is shown by an ellipses to simplify the example:

Device definition R (-) ( . . . ;

As a second example, the following device definition statement may be used to define a transistor M that is modeled by a model referred to as PCH corresponding to a p-channel MOS transistor, and here the port list is shown to define four ports (or terminals), where the first port is an output and the three remaining ports are inputs:

Device definition M (PCH) (D bUT G IN S IN B IN);

While the format of the device definitions in header file $24_3$ has now been demonstrated, in either the preferred embodiment or in various alternatives of the present embodiments various other statements may be included in header file $24_3$ so as to support additional functionality. The statements may facilitate preprocessing, provide input file names, device deletion, define global signal definitions, and switch on (or off) various functions. Some of these statements are discussed below.

Recall that in the preferred embodiment a preprocessor may be used to process the netlist file so that the information therein is processed to provide the preferred flattened form of the devices in the circuit described by the netlist. To facilitate this preprocessing function, header file $24_3$ may include the following preprocessor statement:

preprocessor=[string];

The preprocessor statement defines a preprocessor to be used for the netlist in leaf-cell file $24_1$. Thus, when a string value name for [string] is provided in a preprocessor statement, it is assumed that the named preprocessor accepts standard input and produces a standard output such-that the UNIX pipe mechanism can be used to apply the preprocessor to the leaf-cell file.

Header file $24_3$ also may define, by a circuit statement, a file where the circuit to be tested is further defined, noting that any device in the defined file must be earlier identified by a device definition statement. The defined file should include leaf-level cells. This circuit statement takes the following form:

circuit =[string];

Given the circuit statement, the textual [string] is read by the preferred embodiment and mapped onto its internal list data structures. If [string] is of the format $[number], then [number] is used as an index into an argument vector, referred to in the art as agrv, to identify the file where the circuit under test is further defined; in other words, the identified file name is the element in the agrv vector at the location $[number].

Header file $24_3$ also may define, by a pattern statement, a pattern to be used in a matching comparison function also detailed later. This statement takes the following form:

pattern [name]=[string]

For the pattern statement; the textual [string] identifies a netlist file and as a result of the pattern statement the identified netlist is thereafter associated with [name] for a later comparison.

Header file $24_3$ also may define, by a behavior statement, the file name for a VHDL behavioral model in behavioral reference file $24_2$ and to be used for the circuit under test. This statement takes the following form:

behavior=[string];

If [string] is of the format $[number], then [number] is used as an index into an argument vector, agrv, to produce the name of the behavioral reference file. Given the present behavior statement, note that one or more additional statements may be specified in header file $24_3$ to invoke behavioral checking, using the model specified by the behavior statement, and according to various techniques. For example, an additional statement may be included to define the interface of the circuit being tested, while another statement may define the particular VHDL technique to be used to verify the behavior of the circuit against the model specified by the behavior statement. The actual VHDL verification may be performed according to techniques known in the art. Lastly, note that even if a behavior statement is provided, it has no effect if a behavioral comparison is not performed.

Header file $24_3$ also may include one or more statements for defining global signal names to be used for the entire circuit being verified. Such a global signal statement takes the form:

[name] name=[string];

In the global signal statement, [name]. assigns a name to a signal that has appeared as a textual [string]. For example, the following two statements may be typically used where supply and ground signals are referred to as "vdd" and "gnd":

vdd name="vdd";

gnd name="gnd";

Lastly, note that when extracts from extract file $24_4$ (detailed later) are applied to signal names, an extract statement refers to the signal by [name] from the global signal statement.

Header file $24_3$ also may include one or more statements to delete device connections otherwise specified in the netlist (as defined in a previous device definition statement), thereby effectively changing or overwriting the actual circuit connections without modifying the netlist or the previous device definition statement. Two types of overriding statements are providing, one which deletes a device from the netlist by effectively replacing it with a short circuit and the other of which deletes a device from the netlist by effectively replacing it with an open circuit. These two statements, respectively, take the following form:

short device=[name];

open device=[name];

Header file $24_3$ also may include a switch statement for enabling (or disabling) a debug function, and which takes the form:

debug=[boolean];

If the debug statement is included and the [boolean] value is set to the affirmative (e.g., true, on, yes, 1), then debug printing operations may occur during the circuit testing, where such operations may include file parsing and statement execution. In addition, the creation of lists created by extracts, as detailed later, also may be printed by enabling the debug functionality. In the preferred embodiment, if no debug statement is provided then by default the debug operations are disabled.

Header file $24_3$ also may include a trace statement for enabling (or disabling) a printout associated with the actual lists created by corresponding extracts, and which takes the form:

trace=[boolean];

If the trace statement is included and the [boolean] value is set to the affirmative (e.g., true, on, yes, 1), then printing operations preferably occur to display the contents (i.e., elements) of the lists created by extract statements as those lists are produced. In the preferred embodiment, if no trace statement is provided then by default the trace operations are disabled.

Turning now to the functionality provided by extract file $24_4$, recall that it includes and creates lists where each list has a non-negative integer number of elements, consisting of either devices, signals, or both devices and signals. These lists are determined from the circuit information provided by file $24_3$. Thus, a list may pertain to attributes of the entire circuit described by file $24_3$, or a list may pertain to some subset or sub-circuit of that entire circuit. Some of these lists are automatically generated as detailed below, while others are created from computer code queries written by a user, and the preferred embodiment provides various types of expressions that are acceptable forms for such queries. In either instance, file $24_4$ is named an "extract file" because, in effect, each list therein is extracted from the information already provided by the general circuit information (i.e., files $24_1$ and: $24_3$). The goal of these lists, as further appreciated later, is to, extract information in a manner that may later be tested by the rules in rules file $24_5$, thereby confirming circuit verification (or finding problems therein).

In the preferred embodiment, extract file $24_4$ includes five different lists that are automatically generated based on the information in header file $24_3$. The generation of these five lists is preferably achieved via execution of a program by computer 12, where such a program may be written by one skilled in the art (e.g. using the C programming language in the preferred embodiment) to accomplish the results stated in this document. Looking specifically to these five lists, each list is given a name so that it may be referred to by other code (e.g., by expressions to form other lists or by rules). A first of the extract file lists is referred to as "all_signals" and it is a list of all of the signals in the circuit being analyzed. A second of the extract file lists is referred to as "all_ports" and it is a list of signals that are ports. A third of the extract file lists is referred to as "all_input_ports" and it is a subset of "all_ports" that consists of a list of signals that are input ports. A fourth of the extract file lists is referred to as "all_output_ports" and it is a subset of "all_ports" that consists of a list of signals that are output ports. A fifth of the extract file lists is referred to as "all_devices" and it is a list of devices in the circuit being analyzed.

In the preferred embodiment, extract file $24_4$ also may include lists that are generated by processing various user created queries. These queries are based on various predetermined code statements, where within those code statements various operators may be used referred to herein as list expressions. Thus to appreciate these queries, the following discussion first examines various list expressions that may be included in the preferred embodiment and then second examines the implementation of those list expressions within code statements to form queries, where the result of each query produces a list for extract file $24_4$.

Turning to the list expressions and by way of introduction to a convention used in such expressions, the designation of [expr] as used in the remainder of this document is the name of a list, where the following expressions demonstrate that [expr] may be used to create a new list or as a reference to a previously-created list. When [expr] is used to create a new list, the name used must not have already been used for another list. When [expr] is used as a reference to a previously created list, that list may have zero or more elements.

Extract file $24_4$ may include any of three list expressions based on a different logic operations, a first being an AND operation, a second being an OR operation, and a third being an XOR operation. These operations are defined as follows.

For an AND operation, the expression takes the form:

[expr1] AND [expr2]

The result of the AND expression produces a new list that is the intersection of the lists named [expr1] and [expr2], that is, all elements that are in common between list [expr1] and list [expr2] form the result. By way of example, therefore, this result may be stored in a new list, [expr1], by using the AND expression in the following form:

[expr3] [expr1] AND [expr2]

For an OR operation, the expression takes the form:

[expr1] OR [expr2]

The result of the OR expression produces a new list that is the union of the lists named [expr1] and [expr2]. In addition, elements that are in common in [expr1] and [expr2] are only identified once (i.e., not twice) in the result.

For an XOR operation, the expression takes the form:

[expr1] XOR [expr2]

The result of the XOR expression produces a new list that contains those elements of list [expr1] that are not in list [expr2], and those elements of [expr2] that are not in list [expr1] (i.e., the result is those elements that are only exclusively in either list [expr1] or list [expr2]). A preferred use of the XOR operation, therefore, is to compare two different lists to determine if they have the same elements (i.e., an equivalence operation), where if the result has any elements then the result necessarily indicates that the two compared lists are not equivalent to one another.

Extract file $24_4$ also may include another expression which forms a result based on exclusion, and which takes the form:

[expr1]/[expr2]

The [expr1] [expr2] expression produces a resulting list that is list [expr1] excluding the same item(s) that also are in list [expr2]; further, elements from list [expr2] not present in list [expr1] are not copied to the resulting list. This exclusion operation permits various preferred uses. For example, one use of the present expression is to form a set complement. More particularly, from set theory, if there is a set that contains all possible elements, it is called the universal set or simply the universe. Further, in the context of set theory, the complement of a set "A" is a set "B" that is defined to be all of the elements from the universe except those non-NULL elements contained in set "A". As a result, when set [expr1] is the universe the [expr1]/[expr2] expression produces a result which removes elements of set [expr2] from set [expr1] and thereby is the complement of set [expr2].

Extract file $24_4$ also may include one or more expressions that affirmatively state the elements to be included in a list, in the following form:

[expr1]={([*])};

For example, consider the following definition of a new list referred to as "new_list":

new_list={("element 1 name", element 1 type), ("element 2 name", element 2 type};

In the immediately preceding example, new list is explicitly formed to have the named and typed elements.

Extract file $24_4$ also may include one or more IF-THEN-ELSE expressions, where such an expression takes the form:

if [expr1] then [expr2] else [expr3]

The result of the IF-THEN-ELSE. expression depends on the number of elements in [expr1]. Specifically, if list [expr1]m contains exactly zero elements, the resulting list is a copy of [expr3]; otherwise, the resulting list is a copy of [expr2].

Extract file $24_4$ also may form a list with one element from a given position of the element in another list, using the form:

element [number] of [expr1]

The result of the immediately preceding expression is the single element at position [number], using zero-based numbering, in the list [expr1]. Note that the ordering of elements in a list is not fixed from run to run. However, in the preferred embodiment the ordering of elements in a list is constant until the next assignment, including a copying, to the list.

Extract file $24_4$ also may include numerous other expressions that are referred to herein as queries since they approximate a spoken language analysis of various attributes of list elements or expressions. The queries, like the other expressions provided above, are included within the preferred embodiment in an effort to provide flexibility in forming various different resulting lists, where the number of elements in each resulting list proves useful for further analysis using one or more rules in rules file $24_5$ discussed later. The various queries are discussed below.

The preferred embodiment may include up to any of the six following query expressions in extract file $24_4$, where each such expression in some manner produces a list based on the electrical connections between a signal and a device (or a device port). These five query expressions are as follows.

A first query expression relating to element connections uses the following form:

signals from [expr1] with [number] connections

The result of the immediately preceding query expression is a list of all signals from list [expr1] with a number of device connections equal to [number].

A second query expression relating to element connections uses the following form:

signals from [expr1] touching devices from [expr2]

The result of the immediately preceding query expression is a list of any signal from list, [expr1] with any connection to any device in list [expr2].

A third query expression relating to element connections uses the following form:

signals from [expr1] touching terminal [expr2] of [expr3]

The result of the immediately preceding query expression is a list of any signal from list [expr1] that connects to a specified port [expr2] of device type [expr3].

A fourth query expression relating to element connections uses the following form:

signals from [expr1] touching terminal [expr2] of [expr3] from [expr4]

The result of the immediately preceding query expression is a list of any signal from list [expr1] that connects to port [expr2] of device type [expr3] from the devices contained in list [expr4].

A fifth query expression relating to element connections uses the following form:

devices from [expr1] touching signals from [expr2]

The result of the immediately preceding query expression is a list of any device from list [expr1] that has at least one connection to any signal in list [expr2].

A sixth query expression relating to element connections uses the following form:

devices from [expr1] touching signals from [expr2] with terminal [expr3] of [expr4]

The result of the immediately preceding query expression is a list of any device from list [expr1] that connects to any signal in list [expr2] with port [expr3] of device type [expr4].

Lastly, extract file $24_4$ may include any one or more additional expressions, where each such expression is preferable in that it permits the formation of a list of elements in response to other criteria relative to other expressions.

One additional expression that may be included in extract file $24_4$ uses the following form:

signals from [expr1] matching pattern [string]

The result of the immediately preceding expression is a list of any signal from list [expr1] that matches a so-called "perl" regular expression contained in [sting]. Further in this regard, perl is a programming language that has grammar for describing patterns of letters. Further, regular expressions using this (or possibly other) grammar patterns may be represented by any combination of symbols as well as three operators: (1) concatenation—pattern A concatenated with B matches a match for A followed by a match for B: (2) logical or—pattern A or pattern B matches either a match for A or a match for B; and (3) closure—zero or more matches for a pattern.

Another expression that may be included in extract file $24_4$ uses the following form:

devices from [expr1] of type [expr2]

The result of the immediately preceding expression is a list that is all devices from list [expr1] that are of device type [expr2].

Another expression that may be included in extract file $24_4$ uses the following form:

devices from [expr1] redefined as [expr2]

The result of the immediately preceding expression is a list of all devices-from list [expr1] with their device type replaced by device type [expr2].

Another expression that may be included in extract file $24_4$ uses the following form:

devices from [expr1] with parameter [expr2] [greater than—less than—equal to] [number]

In the immediately preceding expression, note that device "parameters" are referred to whereas the previous expressions deal with device connections. In this manner, the preferred embodiment further augments its device connection analyses with alternative approaches for analyzing device parameters. In this regard and by way of example, device parameters may include devices size or dimension(s), such as the width and length parameters that are associated with transistors. As another example, device parameters may include parasitic elements (e.g., resistance, capacitance) associated with a device. In any event, in one implementation of the preferred embodiment, device connections are described while device parameters are not used to identify devices and, hence, later circuit verification is based only on device connections. This first approach leaves a designer some flexibility in selecting such parameters so that two circuits, having like connections but differing parameters, and when compared will result in a finding of a match between the circuits (i.e., because of the like connections). However, in an alternative embodiment, device parameters may be specified in connection with a device, such as by setting such parameters in the SPICE (or comparable data form) file. In this alternative embodiment, these parameters also may be processed using the immediately preceding expression to analyze the circuit parameters an addition to the already existing ability to evaluate the connections within the circuit. In any event, looking to the details of the immediately preceding expression, only one of "greater than," "less than," and "equal to" is selected for a use of the expression. The result is a list of all devices from list [expr1] that satisfy the numerical comparison to the number [number].

Finally, extract file $24_4$ may include up to three additional expressions, where these expressions relate one list (e.g., sub-circuit) to another and are defined as follows.

A first relational expression that may be included in extract file $24_4$ uses the form:

compare [expr1] to [expr2]

In the preferred embodiment, the immediately preceding expression invokes a graph comparison analysis of [expr1] to [expr2], where each of these two expressions may represent a different sub-circuit of the entire circuit in file $24_1$. More particularly, recalling now that each list according to the preferred embodiment is a group of zero or more elements, and that some lists may contain both signals and devices as elements, then the connections of those elements may be analyzed with techniques from graph theory. Accordingly, for the present expression the graph of one list is evaluated to determine whether it matches the graph of a different list, that is, there is an attempt to correlate each element in one graph with a corresponding element in the other graph. To make this determination, signals and devices are matched from respective lists only if a one-to-one match occurs in the topological connection characteristics of the signals or devices in lists [expr1] and [expr2]. The result of the expression return a list of any mismatches and, thus, the result is empty (or contains a NULL indicator) if the analysis determines that the lists specified by [expr1] and [expr2] match one another. Further, even minor differences in the circuitry described by [expr1] and [expr2] may produce many signals and devices in the resulting output list. Also in the preferred embodiment and with respect to the compare expression, device parameters are not used to identify devices and, thus, are not part of the comparison; instead, such parameters may be evaluated using the above-described expression relating to parameters and the result of that expression may be further tested using one or more rules in rules file $24_5$ as will be appreciated later. Lastly, a preferred methodology for implementing the compare expression is further detailed later in connection with FIG. 3.

A second relational expression that may be included in extract file $24_4$ uses the form:

similar [expr1] to [expr2]

In the preferred embodiment, the immediately preceding expression also invokes a graph similarity analysis of [expr1] to [expr2], where again each of these two expressions may represent a different sub-circuit of the entire circuit in file $24_1$. For the present expression the graph of one list is evaluated to determine whether it is similar to the graph of a different list, where similarity is less conservative than the level of matching required for a NULL determination in the above-described "compare" expression. Nonetheless, to determine similarity in this context, again elements (i.e., signals and/or devices) are matched and similarity is found only a one-to-one match occurs in the topological characteristics of the elements in lists [expr1] and [expr2], and device parameters are not used to identify devices. The result of the expression returns a list of any mismatches in the similarity determination and, thus, the. result is empty (or contains a NULL indicator) if the analysis determines that the lists specified by [expr1] and [expr2] are similar. Further, note that similarity according to the "similar" expression does not require absolute identity between the two lists, but instead allows for a level of variance to accommodate certain type of circuits represented by corresponding lists. In other words, for the "similar" expression, it is assumed that the circuitry represented by the list [expr1] and the circuitry represented by the list [expr2] have characteristics that make a definitive match of all devices and all signals impossible. For example, such an instance may occur where the circuitry represented by [expr1] is schematically a mirror-image of the circuitry represented by [expr1]. For such mirror-image circuits, the terminal connections to elements may be identical but the mirror-image may result in different signal connections.

A third relational expression that may be included in extract file $24_4$ uses the form:

match [expr1] from [expr2] to [expr3]

In the preferred embodiment, the immediately preceding expression first causes a compare operation to occur in the same manner as the "compare": statement discussed above, namely, [expr2] is compared to [expr3] using a graph analysis. The result of this compare operation causes each element in [expr2] to be paired with a corresponding and equivalent element in [expr3]. Next, for every element named in [expr1] that exists in [expr2], the result of the match expression returns the corresponding and equivalent element in [expr3].

Turning now to the functionality provided by rules file $24_5$, in the preferred embodiment rules file $24_5$ includes assertions that evaluate the integer number of elements in a list. Indeed, due to the large flexibility of list analyses provided by the many expressions that may be used in extract file $24_4$, the preferred embodiment implements rules in rules file $24_5$ by way of only two different assertions, again written in the form of computer program code.

A first of the two rules assertions uses the following form:

[list_name] must contain [exactly - - less than - - greater ] than [number] [element - - elements ];

For the immediately preceding rule assertion, the code line is written to select one of the conditions "exactly," "less than," or "greater than", a number of elements to be tested by the condition is set by explicitly providing an integer for [number], and either "element" or "elements" is selected for the assertion based on whether [number] represents the singular or the plural. Accordingly, the rule assertion determines whether the list identified by [list_name] contains the number of elements specified by the remainder of the rule.

A second of the two rules assertions uses the following form:

[list name1] and [list_name2] contain the same number of elements

The immediately preceding rule assertion produces a logical result based on whether [list_name1] and [list_name2] have the same number of elements. For example, this rule may be used to compare two sub-circuits that should be identical in topology and hence have a same number of elements, so a false determination by this rule is a relatively simple, but not conclusive, test that the topologies do not match.

Figure 2:
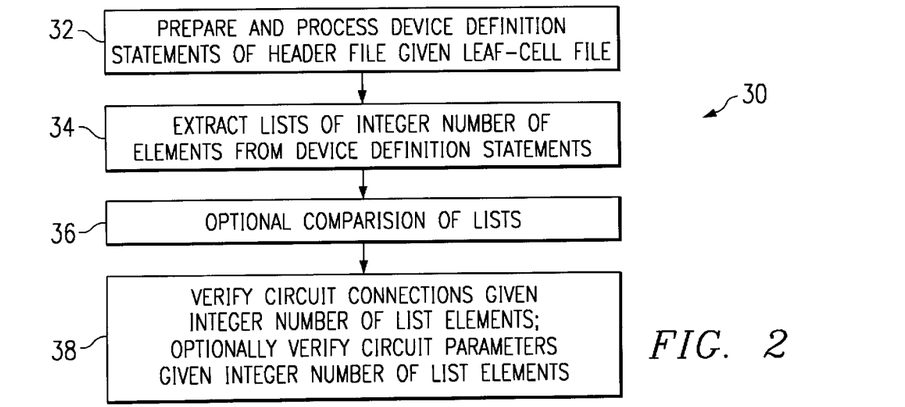
FIG. 2 illustrates a flow chart for processing the files in the secondary storage of the computer system in FIG. 1.

FIG. 2 illustrates a flow chart of a method 30 to further demonstrate the operation of system 10 and the implementation of the preceding teachings. Before further examining these steps, note by way of introduction that method 30 represents the steps of system 10 when programmed by one skilled in the art to implement the above-referenced functionality, where such programming may take numerous forms. For example, in the preferred embodiment, the program to achieve the preferred embodiment is implemented in the C programming language. Rules file $24_5$, as well as any SPICE files and behavioral reference file $24_2$ are parsed by a parameterized language parser. Further, header file $24_3$, extract file $24_4$, and rules file $24_5$ are processed by a pattern matcher that runs on a subset of BNF. When header file $24_3$ is processed, devices and signals are stored in an instance-based linked-list structure and a signal list. When extract file $24_4$ is processed, the resulting lists, as well as the processing results of those lists by rules file $24_5$, are reverse linked lists of structures containing a union of a device and signal pointer. A package of set operations that operates on these list structures is at the core of the extract statements. Further details to implement the preferred programming may be ascertained by one skilled in the art.

Turning now to the steps of method 30, in step 32 system 10 processes the device definition statements for header file $24_3$. Prior to that time, the device definition statements in the present embodiment are manually entered to describe the allowable contents of the leaf-cell file $24_1$ (as further reflected in the netlist provided by one or more circuit design persons). The device definition statements are preferably in the form described earlier, and are then processed in step 32 according to the computer program so as to generate the proper data structures such as those described above in the context of the C computer language. Next, method 30 continues to step 34.

In step 34 system 10 extracts lists from the device definition statements. Certain lists are extracted automatically, as discussed above, while other specific extracted lists depend on the expressions (including queries) written by a circuit designer, such as a master designer. In either case, for each generated list the goal is to provide in the list a set where the list contains a non-negative integer number of elements, those elements being either signals, devices, or both. Next, method 30 continues to step 36.

Step 36 represents an optional step by system 10 wherein a comparison may be made between two different lists (corresponding to sub-circuits), or where numerous comparisons may be made where for each comparison one list is compared to another list. The comparisons may be effected using either the "compare" or "similar" expressions detailed above, where the results therefore identify whether there is an exact match, or a similar match, respectively, between the compared lists. As also. introduced earlier, both comparison operations are based on graph comparisons, where further details on a preferred implementation of such comparisons are provided later in connection with FIG. 3. Following step 36, or following step 34 if the option of step 36 is not taken, method 30 continues to step 38.

In step 38 system 10 verifies one or more connections within the circuit of leaf-cell file $24_1$. Thus, step 38 represents the final determination of whether a connection (or multiple connections) within leaf-cell file $24_1$ satisfies a predetermined criterion, such as a restriction imposed by a master designer. Due to the formation of lists as defined above, each step 38 verification may be achieved, and preferably is achieved, by applying a rule to the actual number of elements existing in a list extracted in step 34. Thus, the results of step 38 complete the verification of the circuit connectivity. In addition to verifying circuit connection in step 38, recall that earlier an embodiment is described to also contemplate the inclusion of device parameters associated with the circuit under test, and these parameters may be extracted using one or more expressions in extract file $24_4$; if this option has been used, then step 38 also optionally verifies one or more circuit parameters. This verification also is preferably achieved by applying a rule to the actual number of elements existing in a list extracted in step 34, where the extracted list is based on the above-described expression relating to device parameters.

Concluding with the discussion of FIG. 2, it is noted that FIG. 2 is necessarily presented in a generalized sense because the preferred embodiment gives rise to myriad applications due to the varying design criteria that may be established for a circuit as well as the various different types of analyses made available given the wide scope of extracting permitted by the expressions detailed above. Thus, to further illustrate the preferred embodiment, an example is now: provided so that one skilled in the art may further appreciate the use of the files $24_3$, $24_4$, and $24_5$ in FIG. 1. The following code follows the conventions introduced above, and again comment lines are shown in the code preceded by a double dash (i.e., "- - ") to further discuss the purpose of the code immediately following or otherwise corresponding to the comment:

```
begin header
    device definition M (PCH)    (D OUT G IN S IN B IN) ;
    device definition M (NCH)    (D OUT G IN S IN B IN) ;
    device definition X (TRP)    (D OUT G IN S IN) ;
    device definition X (TRN)    (D OUT G IN S IN) ;
    device definition R (-)      (T1 INOUT T2 INOUT) ;
    device definition C (-)      (T1 INOUT T2 INOUT) ;
    debug           = no ;
    trace           = no ;
    circuit         = "example_class1.sp" ;
    behavior        = "example_class1.vhdl" ;
```

-continued

```
    pattern holder           = "holder.sp" ;
    vdd name                 = "vdd" ;
    gnd name                 = "gnd" ;
    compare behavior         = yes ;
end header ;
begin extracts
    all_ports = all_input_ports OR all_output_ports OR
    all_inout_ports ;
    -- Verify that a port named 'clock' exists on the port list of
    -- the leaf cell
    clock_list = { ("clock" , signal) , ("CLOCK" , signal) } ;
    clock_port_list = all_ports AND clock_list ;
    -- Verify that all transistor gates are driven by a port or a
    -- node that has at least one n-channel drain connection and
    -- at least one p-channel drain connection
    nodes_driven_by_n_and_p = ( signals from all_signals touching
    terminal D of TRP ) AND ( signals from all_signals touching
    terminal D of TRN ) ;
    can_drive_gate = nodes_driven_by_n_and_p OR all_ports ;
    gate_signals = ( signals from all_signals touching terminal G of
    TRP ) OR ( signals from all_signals touching terminal G of TRN )
    ;
    bad_gate_drivers = gate_signals / can_drive_gate ;
    -- verify that vdd and gnd exist and that they are on the
    -- port list
    vdd_list = { ("VDD", signal) } AND all_signals ;
    gnd_list = { ("GND", signal) } AND all_signals ;
    vdd_port = vdd_list AND all_ports ;
    gnd_port = gnd_port AND all_ports ;
    -- Verify that no transistor has a gate connection to vdd
    -- Verify that no transistor has a gate connection to gnd
    gate_driven_by_rail = ( signals from ( vdd_list OR gnd_list )
    touching terminal G of TRP ) OR ( signals from ( vdd_list OR
    gnd_list ) touching terminal G of TRN ) ;
    -- Verify that no transistor has a floating source
    -- Verify that no transistor has a floating drain
    signals_with_1_connection = signals from all_signals with 1
    connections ;
    floating_source_or_drain = ( signals from
    signals_with_1_connection touching terminal D of TRN ) OR (
    signals from signals_with_1_connection touching terminal D of
    TRP ) OR ( signals from signals_with_1_connection touching
    terminal S of TRN ) OR ( signals from signals_with_1_connection
    touching terminal S of TRP ) ;
    -- Verify that exactly one p-channel transistor exists with
    -- its gate connected to the clock signal and its source
    -- connected to vdd. Label the drain node as the evaluation
    -- node.
    devices_touching_clock = devices from all_devices touching
    signals from clock_list ;
    pch_devices_touching_clock = devices from devices_touch-
    ing_clock of type TRP ;
    precharge_device = devices from pch_devices_touching_clock
    touching signals from clock_list with terminal G of TRP ;
    -- get all the signals touching the precharge device
    precharge_device_signals = signals from all_signals touching
    devices from precharge_device ;
    -- remove clock and vdd from all signals touching the precharge
    -- device to get the evaluation node
    evaluation_node = (precharge_device_signals /
    clock_list) / vdd_list ;
    -- Verify that no n-channel transistor has any connection to Vdd
    devices_touching_vdd = devices from all_devices touching signals
    from vdd_list ;
    nch_devices_touching_vdd = devices from devices_touching_vdd
    of type TRN ;
    -- Verify that no p-channel transistor has any connection to Gnd
    devices_touching_gnd = devices from all_devices touching signals
    from gnd_list ;
    pch_devices_touching_gnd = devices from devices_touching_gnd
    of type TRP ;
    -- Verify that the output port of the leaf cell is not the same
    -- node as the evaluation node
    evaluation_node_is_port = ( all_ports / evaluation_node ) XOR
    all_ports ;
    -- Verify that the output port of the leaf cell is driven by an
    -- inverter
    -- Verify that the output port of the leaf cell drives the gate
    -- of a p-channel transistor
```

-continued

```
    devices_touching_precharge = (devices from all_devices touching
    signals from evaluation_node with terminal G of TRP) OR (devices
    from all_devices touching signals from evaluation_node with
    terminal G of TRN) ;
    output_port = (signals from all_signals touching devices from
    devices_touching_precharge) AND ( all_ports / ( vdd_list OR
    gnd_list ) ) ;
    devices_touching_out = devices from all_devices touching signals
    from output_port ;
    signals_touching_devices_touching_out = signals from all_signals
    touching devices from devices_touching_out ;
    extracted_inverter_holder = devices_touching_out OR
    signals_touching_devices_touching_out ;
    bad_holder = compare extracted_inverter_holder to holder ;
    -- Verify that the output node is low when clock is low
    zero_output_during_precharge = zeros_during_precharge AND
    out_port_list ;
end extracts ;
begin rules
    -- Verify that a port named 'clock' exists on the port list of
    -- the leaf cell
    clock_port_list must contain greater than 0 elements ;
    -- Verify that all transistor gates are driven by an input port
    -- or a node that has at least one n-channel drain connection
    -- and at least one p-channel drain connection
    bad_gate_drivers must contain exactly 0 elements ;
    -- Verify vdd/gnd exists
    vdd_list must contain exactly 1 element ;
    gnd_list must contain exactly 1 element ;
    -- Verify that no transistor has a gate connection to vdd
    -- Verify that no transistor has a gate connection to gnd
    gate_driven_by_rail must contain exactly 0 elements ;
    -- Verify that exactly one p-channel transistor exists with its
    -- gate connected to the clock signal and its source connected
    -- to vdd. Label the drain node as the evaluation node.
    precharge_device must contain exactly 1 element ;
    evaluation_node must contain exactly 1 element ;
    -- Verify that no n-channel transistor has any connection to Vdd
    nch_devices_touching_vdd must contain exactly 0 elements ;
    -- Verify that no p-channel transistor has any connection to Gnd
    pch_devices_touching_gnd must contain exactly 0 elements ;
    -- Verify that the output port of the leaf cell is not the same
    -- node as the evaluation node
    evaluation_node_is_port must contain exactly 0 elements ;
    -- Verify that the output port of the leaf cell is driven by an
    -- inverter
    -- Verify that the output port of the leaf cell drives the gate
    -- of a p-channel transistor
    bad_holder must contain exactly 0 elements ;
    -- Verify that the output node is low when clock is low
    zero_output_during_precharge must contain exactly 1 element ;
end rules ;
```

Figure 3:
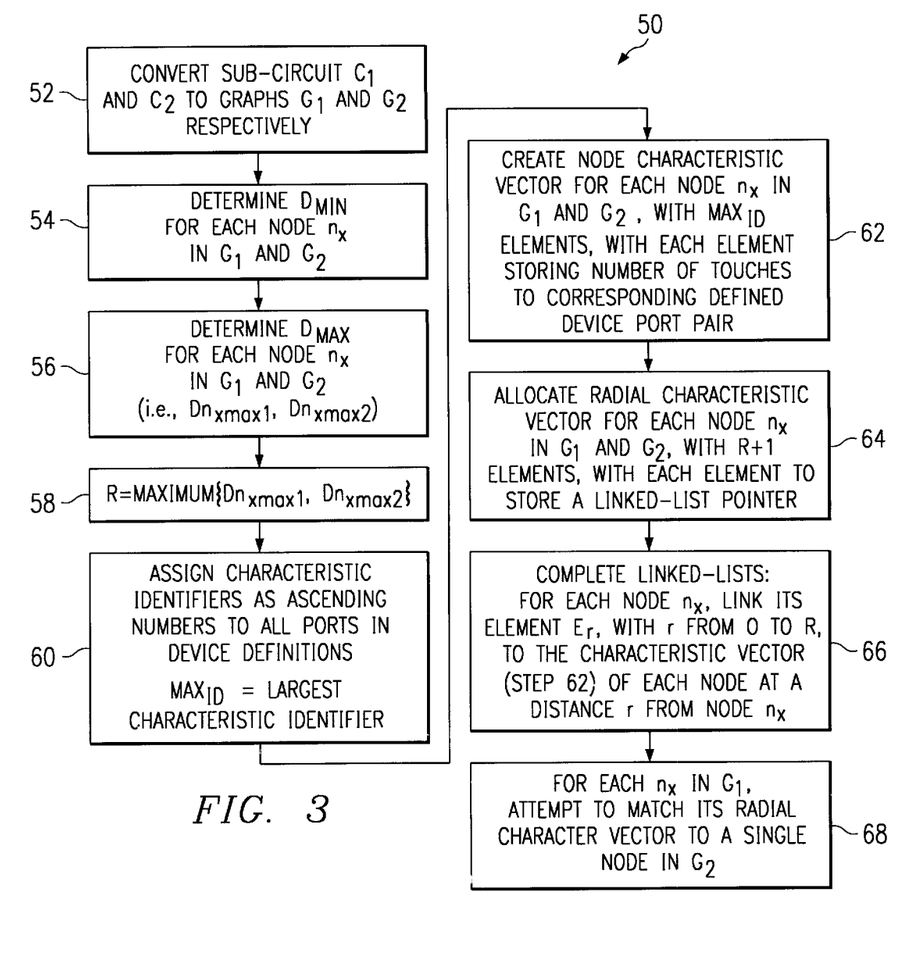
FIG. 3 illustrates a flow chart for comparing two sub-circuits $C_1$ and $C_2$ to one another by creating and processing two respective edge-colored graphs $G_1$ and $G_2$.
Figure 4:
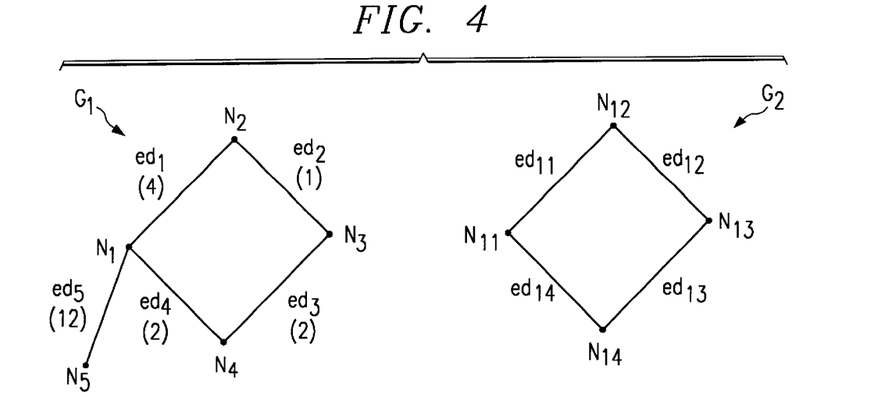
FIG. 4 illustrates an example of the edge-colored graphs $G_1$ and $G_2$.

FIG. 3 illustrates a method 50 according to the preferred embodiment for comparing two sub-circuits described by header file $24_3$ and processed so as to be stored in an instance-based description. Recall that such a comparison is performed by system 10 in response to either the "compare" or "similar" statements discussed above with respect to extract file $24_4$. Recall also that such comparisons are preferably achieved using a graph analysis. Further in this regard, therefore, FIG. 3 illustrates the preferred steps to perform such an analysis. Additionally, FIG. 4 presents a pictorial representation of the graph analysis to further facilitate an understanding of the steps of method 50 in FIG. 3.

Method 50 begins with a step 52 which converts the two sub-circuits, as represented in the instance-based descriptions, to graphs for additional analysis. By way of convention and to facilitate the remaining discussion, let the two sub-circuits be referenced as $C_1$ and $C_2$, with the graphs to which each is converted referenced as $G_1$ and $G_2$, respectively. More particularly, step 52 preferably converts sub-circuits $C_1$ and $C_2$ to edge-colored graphs, where signals from sub-circuit $C_1$ become nodes in graph $G_1$, and devices from sub-circuit $C_1$ become edges in graph $G_1$. Similarly, therefore, signals from sub-circuit $C_2$ become nodes in graph $G_2$ and devices from sub-circuit $C_2$ become edges in graph $G_2$. Further, devices (or devices with an enclosed boundary as discussed earlier) with more than two ports are expanded to multiple edges. By way of a simplified example of step 52 and using an arbitrary number of signals and devices, FIG. 4 illustrate graphs $G_1$ and $G_2$. In FIG. 4, graph $G_1$ includes five nodes $n_1$ through $n_5$ (corresponding to five signals from sub-circuit $C_1$) and five edges $ed_1$ through $ed_5$ between the five nodes $n_1$ through $n_5$ (corresponding to five devices from sub-circuit $C_1$). Further, graph $G_2$ includes four nodes $n_{11}$ through $n_{14}$ (corresponding to four signals from sub-circuit $C_2$) and four edges $ed_{11}$ through $ed_{14}$ between the four nodes $_{11}$ through $n_{14}$ (corresponding to four devices from sub-circuit $C_2$). The numbers shown in parenthesis below the edge identifiers for graph $G_1$ are explained later. Returning to step 52 in FIG. 3, next method 50 continues from step 52 to step 54.

In the preferred embodiment, the graph comparisons in response to the "compare" or "similar" statements are based on distances between corresponding nodes for each of the graphs (assuming corresponding nodes exist in the two graphs), and step 54 begins the measurement of such distances to facilitate the later analysis. Specifically, for each node $n_x$ in both of graphs $G_1$ and $G_2$, step 54 determines a distance, designated $D_{MIN}$, between that node $n_x$ and each other node in the same graph. The distance $D_{MIN}$ is incremented for each edge (i.e., each converted device from a sub-circuit) that is encountered between node $n_x$ and the node to which the distance is being measured. Further, the distance carries a subscript of "MIN" because the distance is determined as the least number of edges encountered in between the nodes being considered (i.e., the shortest path in terms of edges between the nodes, where along the path the same edge is not encountered more than once). For example in FIG. 4 and with respect to graph $G_1$, $D_{MIN}$ from node $n_1$ to node $n_5$ is one because one edge (i.e., $ed_1$) is encountered between those nodes. As another example in FIG. 4 and with respect to graph $G_1$, consider $D_{MIN}$ from node $n_1$ to node $n_4$. Here, there are two paths between these nodes, one which encounters one edge (i.e., $ed_4$) and the other which encounters three edges (i.e., $ed_1$, $ed_2$, and $ed_3$). Recalling that $D_{MIN}$ is the minimum of these two, then $D_{MIN}$ from node $n_1$ to node $n_4$ is one. Given this discussion and the illustration in FIG. 4, one skilled in the art may readily confirm the $D_{MIN}$ values for each node of each of graphs $G_1$ and $G_2$, as shown in the following Tables 1 and 2, respectively:

TABLE 1

($D_{MIN}$ for nodes in graph $G_1$)

| Node | $D_{MIN}$ to $n_1$ | $D_{MIN}$ to $n_2$ | $D_{MIN}$ to $n_3$ | $D_{MIN}$ to $n_4$ | $D_{MIN}$ to $n_5$ |
|---|---|---|---|---|---|
| $n_1$ | 0 | 1 | 2 | 1 | 1 |
| $n_2$ | 1 | 0 | 1 | 2 | 2 |
| $n_3$ | 2 | 1 | 0 | 1 | 3 |
| $n_4$ | 1 | 2 | 1 | 0 | 2 |
| $n_5$ | 1 | 2 | 3 | 2 | 0 |

TABLE 2

($D_{MIN}$ for nodes in graph $G_2$)

| Node | $D_{MIN}$ to $n_{11}$ | $D_{MIN}$ to $n_{12}$ | $D_{MIN}$ to $n_{13}$ | $D_{MIN}$ to $n_{14}$ |
|---|---|---|---|---|
| $n_{11}$ | 0 | 1 | 2 | 1 |
| $n_{12}$ | 1 | 0 | 1 | 2 |
| $n_{13}$ | 2 | 1 | 0 | 1 |
| $n_{14}$ | 1 | 2 | 1 | 0 |

Finally, returning to step 54 in FIG. 3, next method 50 continues from step 54 to step 56.

Step 56 determines, for each of graphs $G_1$ and $G_2$, the largest of the values $D_{MIN}$ for any node in the graph. For sake of reference, the largest value determination of step 56 is indicated generally as $D_{MAX}$, and as $Dn_{xMAX1}$ for the largest $D_{MIN}$ from graph $G_1$ and as $Dn_{xMAX2}$ for the largest $D_{MIN}$ from graph $G_2$. Thus, from Tables 1 and 2, it may be seen that $Dn_{xMAX1}$ equals three and $Dn_{xMAX2}$ equals two. Next, method 50 continues from step 56 to step 58.

Also in the preferred embodiment, the distance comparisons between corresponding nodes from two different graphs are limited to a maximum length, referred to as the maximum search-radius R. Further in this regard, step 58 determines the value of radius R, where R is equal to the larger of $Dn_{MAX1}$ from graph $G_1$ and $Dn_{xMAX2}$ from graph $G_2$ (or equal to either of those values if those values equal one another). Thus, in the example of FIG. 4 and as shown from Tables 1 and 2, the value of R equals three. Next, method 50 continues from step 58 to step 60.

Step 60 is directed to identifying the appropriate number of elements to be used in vectors for subsequent analysis, and it also presents a manner in which the graph edges may become part of a comparison between different graphs. More particularly, step 60 first assigns ascending integer numbers, referred to herein as characteristic identifiers to each unique pair of defined device ports for each device type described in the header file $24_3$, where a "defined device port" is a port on a device definition in header file $24_3$. For sake of reference, each such unique pair is hereafter referred to as a defined device port pair. For example, in header file $24_3$, the following device definitions may be listed:

```
device definition M (PCH)    (D OUT G IN S IN B IN) ;
device definition M (NCH)    (D OUT G IN S IN B IN) ;
device definition X (TRP)    (D OUT G IN S IN) ;
device definition X (TRN)    (D OUT G IN S IN) ;
device definition R (-)      (T1 INOUT T2 INOUT) ;
device definition C (-)      (T1 INOUT T2 INOUT) ;
```

For the first device definition in the preceding list, therefore, there is one or more devices in the corresponding circuit that are represented here by the name M and using a model PCH with four defined device ports (i.e., D, G, S and B). Thus, step 60 assigns ascending integers 0 through 5 to all possible non-repeating, unordered defined device port pairs for the defined device ports of this device. Further, step 60 assigns consecutively increasing integers to the remaining defined device port pairs of the other device definitions, thereby assigning a total of 20 numbers, or characteristic identifiers, as further shown in the following Table 3:

TABLE 3

(characteristic identifiers)

| Defined Device Port Pair | Characteristic Identifier |
|---|---|
| PCH D; PCH G | 0 |
| PCH D; PCH S | 1 |
| PCH D; PCH B | 2 |
| PCH G; PCH S | 3 |
| PCH G; PCH B | 4 |
| PCH S; PCH B | 5 |
| NCH D; NCH G | 6 |
| NCH D; NCH S | 7 |
| NCH D; NCH B | 8 |
| NCH G; NCH S | 9 |
| NCH B; NCH B | 10 |
| NCH S; NCH B | 11 |
| TRP D; TRP G | 12 |
| TRP D; TRP S | 13 |
| TRP G; TRP S | 14 |
| TRN D; TRN G | 15 |
| TRN D; TRN S | 16 |
| TRN G; TRN S | 17 |
| R T1; R T2 | 18 |
| C T1; C T2 | 19 |

Thus, for the example of FIG. 4, then characteristic identifiers would be assigned to each defined device port pair for each device definition statement corresponding to both sub-circuit $C_1$ and $C_2$. To further illustrate the assignment of characteristic identifiers, it is now noted that in FIG. 4 the numbers in parenthesis below each edge identifier for graph $G_1$ are an example of an assignment of a particular characteristic identifier to a corresponding graph edge. For example, edge $ed_1$ has a characteristic identifier of four and edge $ed_2$ has a characteristic identifier of one. In addition because graph edges correspond to a conversion from a device in a circuit, then more than one edge may have a same characteristic identifier: as an example, edge $ed_1$ and edge $ed_4$ have been assigned a characteristic identifier of two. Finally, the largest assigned integer is also set to a value referred to as $MAX_{ID}$, and is used below in step 62. Next, method 50 continues from step 60 to step 62.

Step 62 creates what is referred to herein as a node characteristic vector for each node $n_x$ in graphs $G_1$ and $G_2$, and which is given its name because it relates each node to the characteristic identifiers assigned above. Thus, in the example of FIG. 4, a total of nine node characteristic vectors are created by step 62. Each node characteristic vector has a number of vector storage elements equal to $MAX_{ID}+1$ (i.e., equal to the total number of assigned characteristic identifiers, that is, equal to the total number of defined device port pairs in the device definitions for sub-circuit $C_1$ and $C_2$ in the example of FIG. 4). As to the data stored in the node characteristic vector, each element of a node characteristic vector, for a node $n_x$ corresponds to one of the defined device port pairs of a device definition. More particularly, for a given element in a node characteristic vector and corresponding defined device port pair, the element stores a count value which equals the number of instances that node $n_x$ touches the an edge with the corresponding characteristic identifier. This concept is further represented with reference to the examples of FIGS. 5a and 5b, as further described below.

Figure 5A:
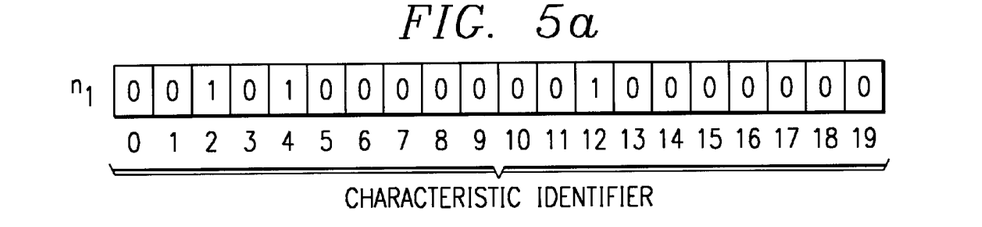
FIG. 5a illustrates the node characteristic vectors for node $n_1$ of graph $G_1$ in FIG. 4.
Figure 5B:
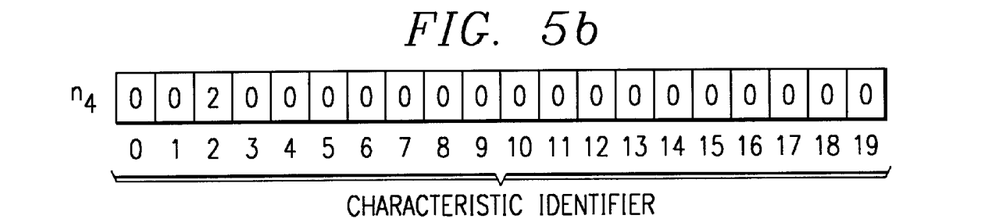
FIG. 5b illustrates the node characteristic vectors for node $n_1$ of graph $G_1$ in FIG. 4.

FIGS. 5a and 5b illustrate the node characteristic vectors for nodes $n_1$ and $n_4$ of graph $G_1$ in FIG. 4. First, note that each node characteristic vector has 18 vector elements because 18 characteristic identifiers were assigned in the preceding example (i.e., $MAX_{ID}+1$ equals 18). Further, each vector element corresponds to a characteristic identifier, as shown. Thus, looking first to the characteristic vector for node $n_1$ in FIG. 5a, each vector element indicates the number of instances that node $n_1$ touches the corresponding defined device port pair.

For example, looking at FIG. 4, it may be seen that node $n_1$ touches three different defined device port pairs, and note that those touches may be represented by the characteristic identifier for those defined device port pairs, namely, characteristic identifier 2 (i.e., edge $ed_4$), 4 (i.e., edge $ed_1$) and 12 (i.e., edge $ed_5$). Further, each of these defined device port pairs is only touched once by node $n_1$. As a result, FIG. 5a illustrates that an indication of one touch is set in each of the vector elements corresponding to characteristic identifiers 2, 4, and 12. Additionally, because node $n_1$ does not touch any of the remaining defined device port pairs, then the vector elements for the remaining characteristic identifiers corresponding to those other defined device port pairs is set to zero in FIG. 5a. As another example, looking to the characteristic vector for node $n_4$ in FIG. 5b, each vector element indicates the number of instances that the node $n_4$ touches the corresponding defined device port pairs. For example, looking to FIG. 4, it may. be seen that node $n_4$ touches only one defined device port pair, and that defined device port pair is represented by the characteristic identifier of 2 (i.e., for both edges $ed_3$ and $ed_4$). As a result, FIG. 5b illustrates that an indication of one touch is set in the vector element corresponding to characteristic identifier 2, while the remaining vector elements: are set to zero because node $n_4$ does not touch any of the remaining defined device port pairs. Next, method 50 continues from step 62 to steps 64 and 66.

Steps 64 and 66, respectively, allocate and complete the formation of what is referred to herein as a radial characteristic vector for each node $n_x$ in graphs $G_1$ and $G_2$. The radial characteristic vector is so named because it relates to the node characteristic vectors defined above in step 62, where the relationship is based on different radii from each node and, hence, the name "radial" characteristic vector. First, step 64 allocates the elements for these radial characteristic vectors, where each vector has R+1 vector elements (recalling that R is the maximum search radius determined in step 58). For the sake of reference, let each of the R+1 vector elements be referred to as $E_r$, where r is from 0 to R. Each element, $E_r$, is for storing a linked-list pointer. Second, in step 66, for each node $n_x$ in one of graphs $G_1$ and $G_2$, and for each vector element $E_r$ with a value of $0 \geq r \geq R$. the vector element links to all node characteristic vectors of each other node in the same graph and at a distance r from node $n_x$. This concept is further represented with reference to the examples of FIGS. 6a and 6b, as further described below.

Figure 6A:
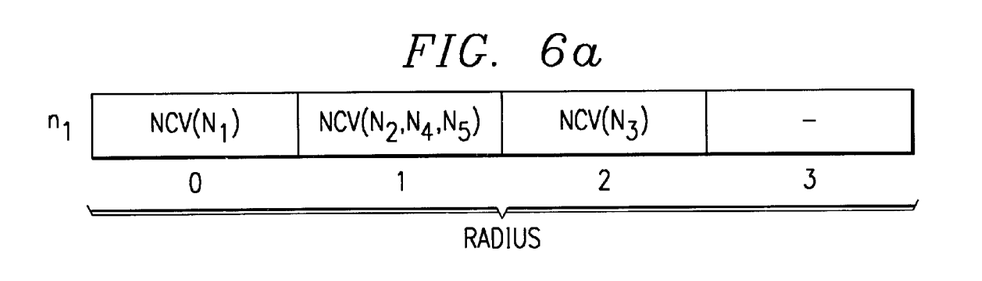
FIG. 6a illustrates the radial characteristic vector for node $n_1$ of graph $G_1$ in FIG. 4.
Figure 6B:
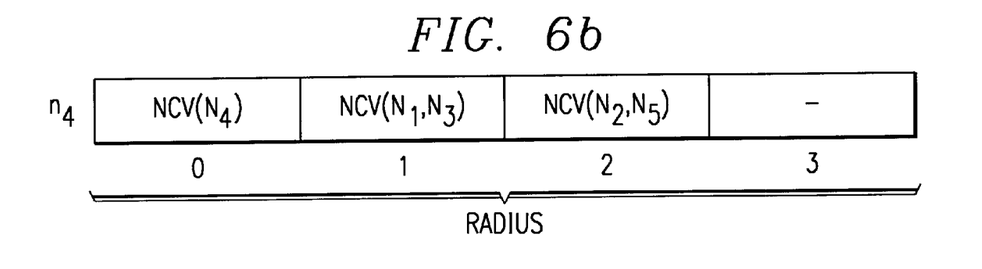
FIG. 6b illustrates the radial characteristic vector for node: of graph $G_1$ in FIG. 4.

FIGS. 6a and 6b illustrate the radial characteristic vectors for nodes $n_1$ and $n_4$ of graph $G_1$ in FIG. 4. First, note that each node characteristic vector has four vector elements, that is, R+1 equals four. Further, each vector element corresponds to a different radius as shown. Thus, looking first to the radial characteristic vector for node $n_1$ in FIG. 6a, each vector element is a pointer to the node characteristic vector (abbreviated "NCV" in the Figure) or vectors for the corresponding radius. For example, only node $n_1$ is located at a radius of zero from itself and, thus, the first vector element in the radial characteristic vector for node $n_1$ merely points to the node characteristic vector for node $n_1$. As another example, for a radius of one, then FIG. 4 demonstrates that there are three nodes at a radial distance of one from node $n_1$ and, thus, the second vector element in the radial characteristic vector for node $n_1$ points to the node characteristic vector for those nodes (i.e., nodes $n_2$, $n_4$, $n_5$). As a final example with respect to the radial characteristic vector of node $n_1$, however, note from FIG. 4 that no node is at a radius of three from node $n_1$. Accordingly, the last element of the radial characteristic of vector node $n_1$, and which corresponds to a radius of three, does not link to any node characteristic vector (i.e., and is shown in FIG. 6a as "-"). As still another example, looking first to the radial characteristic vector for node $n_4$ in FIG. 6b, each of its vector elements points to the node characteristic vector or vectors for the radius corresponding to the vector element. Thus, at a radius of zero the first vector element merely points to the node characteristic vector for node $n_4$. As another example, for a radius of one, then FIG. 4 demonstrates that there are two nodes at a radial distance of one from node $n_4$ and, thus, the second vector element in the radial characteristic vector for node $n_4$ points to the node characteristic vectors for those two nodes (i.e., nodes $n_1$, $n_3$). The remaining element values may be verified given the previous illustrations and examples. In any event, therefore, one skilled in the art should now appreciate that the earlier-described step 62 formed a node characteristic vector which identifies the number of touches to each defined device port pair (via its characteristic identifier) for each given node; in contrast, the step 66 radial characteristic vector provides a manner to link to, and thereby have access to, the number of touches to each defined device port pair for any node that is at the radius R from the given node. Next, method 50 continues from step 66 to step 68.

When step 68 is reached by method 50, all data structures have been allocated and initialized so that a comparison operation may be achieved, and in the preferred embodiment the comparison is effected using iterations to evaluate different nodes in the created data structures. In this regard, step 68 attempts to identify a node from graph $G_1$ as corresponding to a node from graph $G_2$. More particularly, for each node $n_x$ in graph $G_1$, step 68 attempts to match its radial characteristic vector to the radial characteristic vector of a single node in graph $G_2$. In other words, for a node in a first graph touching various different defined device port pairs and with the number of touches to each of those different defined device port pairs being identified in the node characteristic vector of the node, there is an attempt to match that node to a node in a second graph which has the same touching values, that is, it also touches the same set of different defined device port pairs as the node in the first graph, and the number of touches for the node to each defined device port pair is the same as that for the node in the first graph. If, for a given node $n_x$ in graph $G_1$ no match is found between its radial characteristic vector and that of a node in graph Gthen it may be concluded that graphs $G_1$ and $G_2$ do not match; nonetheless, in this case, in the preferred embodiment step 68 continues to attempt to evaluate the remaining nodes in graph $G_1$ to determine if the radial characteristic vector for each of them may be identified as corresponding to the radial characteristic vector of a node in graph $G_2$. In addition, note there is also the possibility that for a given node $n_x$ in graph $G_1$ more than one match is found between its radial characteristic vector and that of a node in graph $G_2$; in this case, the result is inconclusive and thus no match can be identified for node $n_x$ in this pass. Finally, if only a single match is found between the radial characteristic vectors for a node $n_x$ in graph $G_1$ and a node in graph $G_2$, then the radial characteristic vectors for each matching node are replaced with an indication that the nodes have been matched to one another.

Also in view of the data structures as well as the identification process of step 68, note that further steps may be taken according to the preferred embodiment for comparing one sub-circuit to another sub-circuit (with each sub-circuit being represented by a corresponding graph and processed as described above). For example, given two nodes $n_1$ and $n_2$ from graphs $G_1$ and $G_2$, respectively, and further given their respective node characteristic vectors $v_1$ and $v_2$, a match may be found between nodes $n_1$ and $n_2$ if node $n_1$ has been identified as corresponding to node $n_2$ by step 68. As another example, given two nodes $n_1$ and $n_2$ from graphs $G_1$ and $G_2$, respectively, and further given their radial characteristic vectors $vr_1$ and $vr_2$, a match may be found between nodes $n_1$ and $n_2$ by comparing the radial characteristic vectors lists at index i (for $0 \geq i \geq R$) for $n_1$ and $n_2$ where, if there is any mismatch, then there is a mismatch between $n_1$ and $n_2$. In other words, taking a first node in a first graph and then locating a second node in the first graph that is at a certain radius from the first-node in the first graph, and given that the second node touches various different defined device port pairs and with the number of touches to each of those different defined device port pairs being determined, there is an attempt to match the same characteristic to a second graph by evaluating the same attributes by applying the same radius between a first node and a second node in the second graph, that is, a match occurs if given the radius which defines the location of the second node in the second graph, the second node in the second graph has the same touching values, that is, it also touches the same group of different defined device port pairs as the node in the first graph, and the number of touches for the node to each different defined device port pair is the same as that for the node in the first graph. Further, this analysis may be performed for a set of different radii with respect to both the first and second graphs (using the same one of the radii for each corresponding comparison). In all events, recall that when a match is found in response to a "compare" or "similar" statement, then the match determination is reflected by providing no elements in the list resulting from the statement; thus, the match may be detected by a rule which evaluates whether the list resulting from the statement has either zero elements (i.e., indicating a match) or more than zero elements (i.e., indicating a mismatch).

From the above, it may be appreciated that the above embodiments provide a computer-assisted system for verifying circuit connection properties. Connection properties are verified in the preferred embodiment in response to lists formed in response to circuit signal and device definitions. Further, verification is preferably completed by evaluating the number of elements in one or more lists. Still further, certain of thee lists may be formed using an equivalence checking approach (e.g., "compare" and "similar" statements) where two sub-circuits are evaluated by examining the sub-circuits as represented in graph form versus one another, where the graphs may be processed to present criteria for comparison, such as in vector form. In the preferred embodiment, the criteria considered may include the number of defined device port pairs connected to a given node as well as the number of defined device port pairs connected to nodes at one or more radii from the given node. In all events, the use of computer-assisted system for verifying circuit connection properties provides numerous advantages over the prior art. For example, the preferred embodiment may reduce the effort, time, and attention required by a master designer or other person responsible for circuit connection verification. Further, the preferred embodiment reduces the chances of human error in the circuit connection verification processes. As a result of these examples, the chance of later circuit failure due to circuit design error is reduced, thereby improving the overall circuit design as its proceeds to later stages of the circuit development and implementation. As yet a final benefit of the preferred embodiment, while the present embodiments have been described in detail, various substitutions, modifications or alterations could be made to the descriptions set forth above without departing from the inventive scope which is defined by the following claims.

What is claimed is:

1. A computer system, comprising:

processing circuitry;

storage circuitry for storing a plurality of files, the plurality of files comprising:
 a circuit description file comprising data describing devices and signals in a circuit;
 a plurality of list expressions relating to one of devices, signals, or devices and signals described by the data in the circuit description; and
 a plurality of rules; and wherein the processing circuitry is programmed to perform the steps of:
 processing the plurality of list expressions to extract a plurality of lists in response to the circuit description, wherein each of the plurality of lists comprises a non-negative integer number of elements; and
 processing the plurality of rules to evaluate one or more of the plurality of lists to verify connection accuracy within the circuit in response to the non-negative integer number of elements.

2. The computer system of claim 1:

wherein the circuit description file describes a circuit comprising at least a first and second sub-circuit; and wherein the processing circuitry is further programmed to perform the steps of:
 forming a first graph in response to the first sub-circuit;
 forming a second graph in response to the second su-circuit; and
 comparing the first graph to the second graph to determine whether the first sub-circuit matches the second sub-circuit.

3. The computer system of claim 2 wherein each of the first and second sub-circuits comprises both signals and devices.

4. The computer system of claim 3:

wherein the first graph comprises a first set of edges and a first set of nodes;

wherein the second graph comprises a second set of edges a second set of nodes;

wherein the step of forming a first graph in response to the first sub-circuit comprises converting signals from the first sub-circuit to nodes in the first graph and converting devices from the first sub-circuit to edges in the first graph; and wherein the step of forming a second graph in response to the second sub-circuit comprises converting signals from the second sub-circuit to nodes in the second graph and converting devices from the second sub-circuit to edges in the second graph.

5. The computer system of claim 4:

wherein each of the first set of edges is associated with a first set of characteristic identifiers;

wherein each of the second set of edges is associated with a second set of characteristic identifiers; and wherein the step of comparing the first graph to the second graph to determine whether the first sub-circuit matches the second sub-circuit comprises:
 determining for each given node in the first graph a number of instances that the given node in the first graph touches each characteristic identifier in the first set of characteristic identifiers;
 determining for each given node in the second graph a number of instances that the given node in the second graph touches each characteristic identifier in the second set of characteristic identifiers; and
 comparing the number of instances that the given node in the first graph touches each characteristic identifier in the first set of characteristic identifiers with the number of instances that the given node in the second graph touches each characteristic identifier in the second set of characteristic identifiers.

6. The computer system of claim 5 wherein the step of deterring for each given node in the first graph a number of instances comprises forming a node characteristic vector for each given node in the first graph;

wherein the step of determining for each given node in the second graph a number of instances comprises forming a node characteristic vector for each given node in the second graph; and wherein the step of comparing the first graph to the second graph to determine whether the first sub-circuit matches the second sub-circuit further comprises:
 forming a radial characteristic vector for each of a plurality of nodes in the first graph, wherein the radial characteristic vector comprise a number of vector elements corresponding to different radii in the first graph, and wherein each vector element identifies any node characteristic vector for the radius corresponding to the vector element;
 forming a radial characteristic vector for each of a plurality of nodes in the second graph, wherein the radial characteristic vector comprise a number of vector elements corresponding to different radii in the second graph, and wherein each vector element identifies any node characteristic vector for the radius corresponding to the vector element; and
 comparing the radial characteristic vectors for one or more of the plurality of nodes in the first graph to the radial characteristic vectors for one or more of the a plurality of nodes in the second graph.

7. The computer system of claim 1:

wherein the circuit description file describes a circuit comprising at least a first and second sub-circuit; and wherein the processing circuitry is further programmed to perform the steps of:
 forming a first graph in response to the first sub-circuit;
 forming a second graph in response to the second sub-circuit; and
 comparing the first graph to the second graph to determine whether the first sub-circuit is similar to the second sub-circuit.

8. The computer system of claim 1 wherein the data comprises leaf-cell data.

9. The computer system of claim 1 wherein the data comprises SPICE data.

10. The computer system of claim 1:

wherein the data comprises a plurality of device names;

wherein for selected ones of the device names the data further comprises device model identifiers; and wherein for selected ones of the device names the data further comprises device port identifiers.

11. The computer system of claim 1 wherein the circuit description file further comprises data for overriding a device connection in the data describing devices and signals in a circuit.

12. The computer system of claim 11 wherein the data for overriding a device connection creates an open circuit in place of a device connection.

13. The computer system of claim 11 wherein the data for overriding a device connection creates a short circuit in place of a device connection.

14. The computer system of claim 1 wherein the plurality of list expressions comprise an expression for forming a list consisting of an intersection between elements of a first expression-with elements of a second expression.

15. The computer system of claim 1 wherein the plurality of list expressions comprise an expression for forming a list consisting of a union between elements of a first expression with elements of a second expression.

16. The computer system of claim 1 wherein the plurality of list expressions comprise an expression for operating with respect to a first list and a second list, and for forming a list consisting of elements that are only in the first list and not in the second list and only in the second list and not in the first list.

17. The computer system of claim 1 wherein the plurality of list expressions comprise an expression for operating with respect to a first list and a second list, and for forming a list consisting of all elements in the first list other than elements that are common to both the first list and the second list.

18. The computer system of claim 1 wherein the plurality of list expressions comprise an expression for operating with respect to a first list and a second list and a third list, and for forming a list consisting of either elements of the third list if the first list has zero elements or elements of the second list if the first list does not have zero elements.

19. The computer system of claim 1 wherein the plurality of list expressions comprise an expression for defining a list having an element taken from an ordered location in another list.

20. The computer system of claim 1 wherein the plurality of list expressions comprise an expression for forming a list consisting of all signals from a specified list having a number of connections to any device.

21. The computer system of claim 1 wherein the plurality of list expressions comprise an expression for operating with respect to a first list and a second list, and for forming a list consisting of any signal from the first list with any connection to any device in the second list.

22. The computer system of claim 1 wherein the plurality of list expressions comprise an expression for operating with respect to a first list and a second list and a third list, and for forming a list consisting of any signal from the first list that connects to a port specified in the second list and of a of a device type specified in the third list.

23. The computer system of claim 1 wherein the plurality of list expressions comprise an expression for operating with respect to a first list and a second list and a third list and a fourth list, and for forming a list consisting of any signal from the first list that connects to a port specified in the second list and of a of a device type specified in the third list and from devices contained in the fourth list.

24. The computer system of claim 1 wherein the plurality of list expressions comprise an expression for operating with respect to a first list and a second list, and for forming a list consisting of any device from the first list that has at least one connection to any signal in the second list.

25. The computer system of claim 1 wherein the plurality of list expressions comprise an expression for operating with respect to a first list and a second list and a third list and a fourth list, and for forming a list consisting of any device from the first list that connects to any signal in the second list by a port specified in the third list and where the any device is of the type specified in the fourth list.

26. The computer system of claim 1 wherein the plurality of list expressions comprise an expression for forming a list that matches a string pattern.

27. The computer system of claim 1 wherein the plurality of list expressions comprise an expression for operating with respect to a first list and a second list, and for forming a list consisting of all devices from the first list that are of a device type specified by the second list.

28. The computer system of claim 1 wherein the plurality of list expressions comprise an expression for operating with respect to a first list and a second list, and for forming a list consisting of all devices from the first list and having a device type redefined to be a device type specified by the second list.

29. The computer system of claim 1 wherein the plurality of list expressions comprise an expression for operating with respect to a first list and a second list, and for forming a list consisting of all devices satisfying a numeric comparison made with respect to a parameter specified by the second list.

30. The computer system of claim 29 wherein the processing circuitry is further programmed to perform the step of processing at least one of the plurality of rules to evaluate the list consisting of all devices satisfying a numeric comparison made with respect to a parameter specified by the second list.

31. A computer system, comprising:
  processing circuitry;
  storage circuitry for storing a plurality of files, the plurality of files comprising:
    a circuit description file comprising data describing devices and signals in a circuit;
    a plurality of list expressions relating to one of devices, signals, or devices and signals described by the data in the circuit description; and
    a plurality of rules; and
  wherein the processing circuitry is programmed to perform the steps of:
    processing the plurality of list expressions to extract a plurality of lists in response to the circuit description; and
    processing the plurality of rules to evaluate one or more of the plurality of lists to verify connection accuracy within the circuit.

32. The computer system of claim 31:
  wherein the circuit description file describes a circuit comprising at least a first and second sub-circuit; and
  wherein the processing circuitry is further programmed to perform the steps of:
    forming a first graph in response to the first sub-circuit;
    forming a second graph in response to the second sub-circuit; and
    comparing the first graph to the second graph to determine whether the first sub-circuit matches the second sub-circuit.

* * * * *